United States Patent [19]

Rotay et al.

[11] Patent Number: 5,532,639

[45] Date of Patent: Jul. 2, 1996

[54] METHOD AND STRUCTURE FOR IMPROVING RF AMPLIFIER GAIN, LINEARITY, AND SWITCHING SPEED UTILIZING SCHOTTKY DIODE TECHNOLOGY

[75] Inventors: Craig J. Rotay, Lansdale; Christopher Zielke, E. Greenville, both of Pa.

[73] Assignee: SGS-Thomson Microelectronics, Inc., Carrollton, Tex.

[21] Appl. No.: 221,089

[22] Filed: Mar. 31, 1994

[51] Int. Cl.$^6$ ................................................ H03G 3/30
[52] U.S. Cl. .................... 327/376; 327/377; 327/314; 330/296
[58] Field of Search ............................. 327/579, 580, 327/583, 584, 585, 586, 314, 325, 374–379, 380–384; 330/296

[56] References Cited

U.S. PATENT DOCUMENTS

| | | | |
|---|---|---|---|
| 3,327,131 | 12/1961 | Grimmer | 327/583 |
| 3,345,578 | 3/1964 | Shuda | 330/296 |
| 3,382,445 | 5/1968 | Williams | 330/296 |
| 3,513,406 | 5/1970 | Leuthauser . | |
| 5,319,315 | 6/1994 | Belcher | 327/579 |
| 5,363,058 | 11/1994 | Sasaki | 330/277 |

OTHER PUBLICATIONS

Transistor Runs Pseudo Class A In Power Driver (Electronic Design Nov. 25, 1959).
Electronic Circuits (Donald L. Schilling, pp. 43–45) Third Edition 1989.

*Primary Examiner*—Timothy P. Callahan
*Assistant Examiner*—T. Lam
*Attorney, Agent, or Firm*—Renee M. Larson; Lisa K. Jorgenson

[57] ABSTRACT

According to the present invention, schottky diode technology is used to limit the amount of stored charge which must be overcome by an RF transistor during the portion of an RF cycle when the RF transistor attempts to turn on. Limiting the amount of stored charge stabilizes the bias point of the RF transistor on its load line so that the mode of operation of the RF transistor may be maintained. Thus, a schottky diode is placed in a RF transistor circuit and acts as a current sink to bleed stored charge to ground. Placement of the schottky diode close to the RF transistor provides a number of benefits, including introduction of the schottky diode at a low impedance point of the RF transistor circuit, minimization of lead/lag phase angles introduced by intervening matching elements, and minimization of resonance effects. The maximum benefit may be realized by placing the schottky diode as close to the RF transistor as possible, with especially good results possible by placing the schottky diode inside the RF transistor package, such as on a MOS-CAP or on the RF transistor die itself. Furthermore, placement of the schottky diode within the matching network of the RF transistor limits the maximum negative deviation of the input signal to –0.2 to –0.3 volts. Placement of the schottky diode within the RF transistor package causes the schottky diode to be forward biased during the negative half of the RF input cycle, thereby not allowing the RF transistor's base-emitter junction to be sufficiently reverse biased to store charge.

25 Claims, 2 Drawing Sheets

METHOD AND STRUCTURE FOR IMPROVING RF AMPLIFIER GAIN, LINEARITY, AND SWITCHING SPEED UTILIZING SCHOTTKY DIODE TECHNOLOGY

BACKGROUND OF THE INVENTION

The present invention relates generally to RF amplifiers, and more specifically to utilization of schottky diode technology in RF amplifier circuitry to achieve increased RF amplifier gain, linearity, and switching speed.

Many RF power products commonly utilize multiple RF amplifier chains, with each successive RF amplifier chain having increased power and gain specifications with regard to the initial RF input signal provided to the RF amplifier system. In such RF power products, each RF amplifier chain ordinarily delivers a predetermined output level, and in pulsed mode may have a duty cycle that varies anywhere from 0% to 100%. One problem commonly encountered in achieving a digitally pure, distortionless reproduction of the initial RF input signal is that each amplifier of a chain must possess extremely fast switching speeds; often rise times of an amplifier must not exceed 10 to 20 pS, for example. A related problem exists in analog amplifiers when they tend toward compression and linear performance begins to degrade due to unchecked base-emitter rectification in common emitter mode. Examples of technologies which use multiple RF amplifier chains are digital television, digital and analog cellular telephone systems, and personal communications networks (PCNs), which presently operate up to 2 GHz. In these technologies, gain, linearity, and efficiency are prioritized and occasionally used as tradeoffs depending on system requirements.

One method which may be used to accomplish extremely fast amplifier switching speeds is to utilize common emitter rather than common base devices in the amplifier circuitry. However, while common emitter devices inherently offer fast amplifier switching speeds by significantly reducing rise time, there exists a tradeoff between gain and efficiency inherent to the two device configurations which must be considered. Thus, the gain and linearity which may be achieved in the Class AB mode of operation may be sacrificed for enhanced efficiency if the device operates in the Class B or Class C mode of operation. A logical progression, then, might be to use common emitter devices in the Class AB mode when a higher gain and linearity (less distortion) is desired and to use common emitter devices in the Class B or Class C mode of operation when increased efficiency is desired. Thus, for a variety of RF power technologies which use RF amplifier chains, there currently is a need to balance the characteristics of common emitter mode, common base mode, Class AB, Class B and Class C operation so as to achieve desired gain, linearity, switching speed, and efficiency.

A problem commonly encountered with transistor devices of a RF amplifier is that of a sliding bias or quiescent (Q) point of a transistor device. A common emitter RF transistor utilized in an RF amplifier is typically on for the positive half of the RF input signal cycle and off for the negative half of the RF input signal cycle. During the negative half of the cycle when the RF transistor is off and reverse or back biased, the capacitance of the base-emitter junction of the RF transistor increases in magnitude as the voltage of the RF input signal increases in a negative-going direction, thereby accumulating stored charge during the negative half of the cycle. The greater the amplitude of the negative-going voltage of the RF input signal during the negative half of the RF cycle, the greater the amount of stored charge accumulated by the capacitance of the base-emitter junction of the RF transistor, and the further the RF transistor's bias point slides toward class C operation.

Referring to FIG. 1, the Vbe bias curve of a RF transistor during the negative half and positive half of a RF cycle is shown. The voltage represented by the Vbe bias curve is allowed to increase, when unchecked, in a negative-going direction during the negative half of the RF cycle to some voltage X. Typically, the voltage at point X can become very strongly negative, depending on the bias network of the RF transistor, and is limited by the maximum permissible deviation dictated by the $BV_{EBO}$, the breakdown voltage of the emitter-base junction with the collector open, of the RF transistor.

The stored charge accumulated by the capacitance of the base-emitter junction represents a significant problem for the RF transistor during the subsequent positive half cycle of the RF input signal. When the RF transistor attempts to turn on, it must overcome this reactively stored charge, which necessarily impedes the switching speed of the RF transistor. As the RF transistor thus attempts to move from a reverse bias to a forward bias condition, the base-emitter rectification pushes the bias point of the RF transistor in a negative direction down the load line of the device, thereby affecting the class of operation of the device. Thus, a transistor in the Class AB mode of operation may be forced into a Class B or even a Class C mode of operation. This is the sliding bias point problem.

The movement from one class of operation to another class of operation has obvious effects on gain, linearity, and efficiency. For example, for a transistor in the Class AB mode of operation, it is desirable to establish a bias point which will be held relatively constant so that constant gain may be achieved until the transistor is in its saturation region. Otherwise, a sliding bias point is a source of nonlinear distortion. Thus, there is a current unmet need in the art to stabilize the bias point as much as possible by minimizing the negative voltage level during a negative half of the cycle so that base-emitter junction stored charge is minimized and thus changes in mode of operation associated with a sliding bias point are minimized. Ideally, the bias point should remain at a quiescent or operating point of approximately 0.7 volts.

U.S. Pat. No. 3,513,406 granted on May 19, 1970 to Charles B. Leuthauser, enclosed in the attached Information Disclosure Statement filed herewith, discloses a circuit and a method for limiting the negative-going voltage of the RF input signal during the negative half of the RF cycle. The 3,513,406 patent utilizes a compensating network, shown in FIG. 2 of the Leuthauser patent, which features a diode 35 that becomes forward biased and conducts when the Vbe bias becomes sufficiently negative at point Pc. Referring to FIG. 2, a Vbe bias curve representative of the improvement disclosed in the 3,513,406 patent is shown. When the power output level of the RF transistor exceeds point Pc, the RF transistor 20 remains biased at −0.7 volts. During the negative half of the RF cycle, the Vbe DC bias level drops from 0.7 volts to an average DC level of −0.7 volts before leveling off, and since the DC biasing network may become reactively charged, the peak AC excursions may become strongly negative until reaching the $BV_{EBO}$ of the RF transistor.

The compensating network described in the 3,513,406 patent represents a tremendous improvement over the prior art where the amount of negative-going voltage during the negative half cycle was not limited at all. By limiting the bias point to −0.7 volts, RF transistor 20 has much less stored charge to overcome during a subsequent positive half cycle. While the Leuthauser patent was an improvement, there continues to be an unmet need in the art to minimize base-emitter capacitor stored charge even more so that the gain, linearity, switching speed, and efficiency associated with a given class of operation may be preserved and enhanced. Additionally, while the Leuthauser patent limits the average level of stored charge, there remains the need to eliminate or dissipate the strongly negative level of reactively stored charge in the biasing network during the negative half of the RF input signal. Not so limiting this reactively stored charge has an additional, harmful impact on linearity and can degrade the reliability of the RF transistor as well.

SUMMARY OF THE INVENTION

It is therefore an object of the present invention to decrease the negative-going voltage of a RF input signal during the negative half of a RF cycle such that the amount of charge which is stored by the base-emitter junction of the RF transistor is minimized and the bias point of the RF transistor is correspondingly held to a relatively constant value.

It is therefore further an object of the present invention to limit the strongly negative level of reactively stored charge in the biasing network of the RF transistor during the negative half of the RF cycle, so that adverse affects on linearity and reliability of the RF transistor may be minimized.

Therefore, according to the present invention, schottky diode technology is used to limit the amount of stored charge which must be overcome by an RF transistor during the portion of an RF cycle when the RF transistor attempts to turn on. Limiting the amount of stored charge stabilizes the bias point of the RF transistor on its load line so that the mode of operation of the RF transistor may be maintained. Thus, a schottky diode is placed in a RF transistor circuit and acts as a current sink to bleed stored charge to ground.

Placement of the schottky diode close to the RF transistor provides a number of benefits, including introduction of the schottky diode at a low impedance point of the RF transistor circuit, minimization of lead/lag phase angles introduced by intervening matching elements, and minimization of resonance effects. The maximum benefit may be realized by placing the schottky diode as close to the RF transistor as possible, with especially good results possible by placing the schottky diode inside the RF transistor package, such as on a MOSCAP or on the RF transistor die itself. Furthermore, placement of the schottky diode within the matching network of the RF transistor limits the maximum negative deviation of the input signal to −0.2 to −0.3 volts. Placement of the schottky diode within the RF transistor package causes the schottky diode to be forward biased during the negative half of the RF input cycle, thereby not allowing the RF transistor's base-emitter junction to be sufficiently reverse biased to store charge.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The present invention utilizes schottky diode technology to limit the amount of stored charge which a RF transistor must overcome in attempting to turn on during the positive half of a RF cycle, by reducing the amount of charge stored by the capacitance of the base-emitter junction of the RF device. The present invention is suitable for use in a variety of RF power products such as digital television, digital and analog cellular telephone systems, and personal communications networks (PCNs) where gain, linearity, and efficiency are important considerations.

Figure 1:
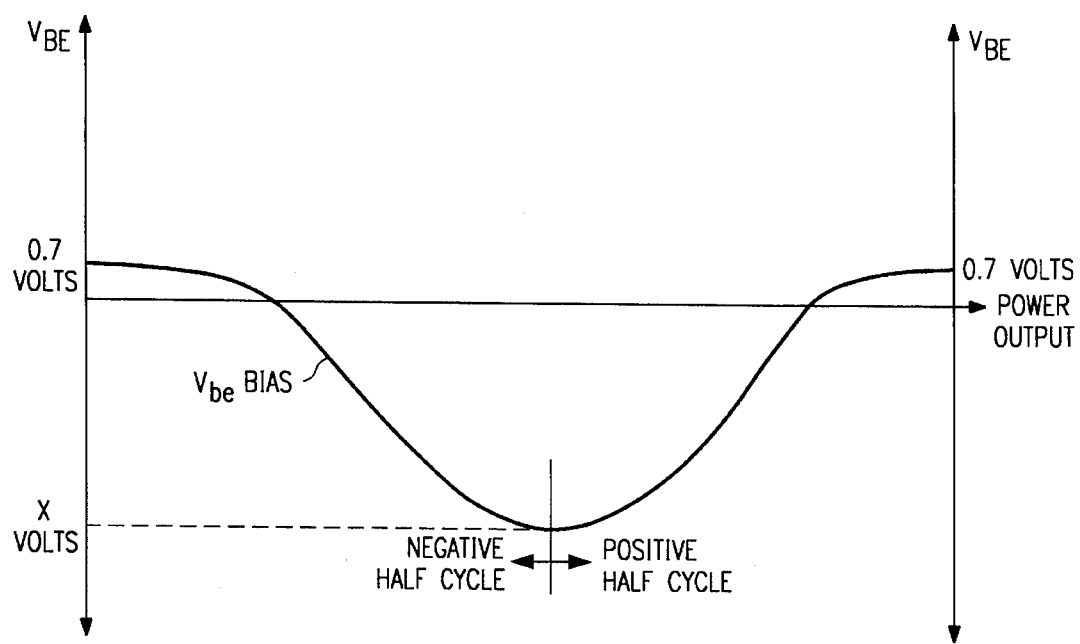
FIG. 1 is a graph showing a first Vbe bias curve for a RF transistor, according to the prior art.
Figure 2:
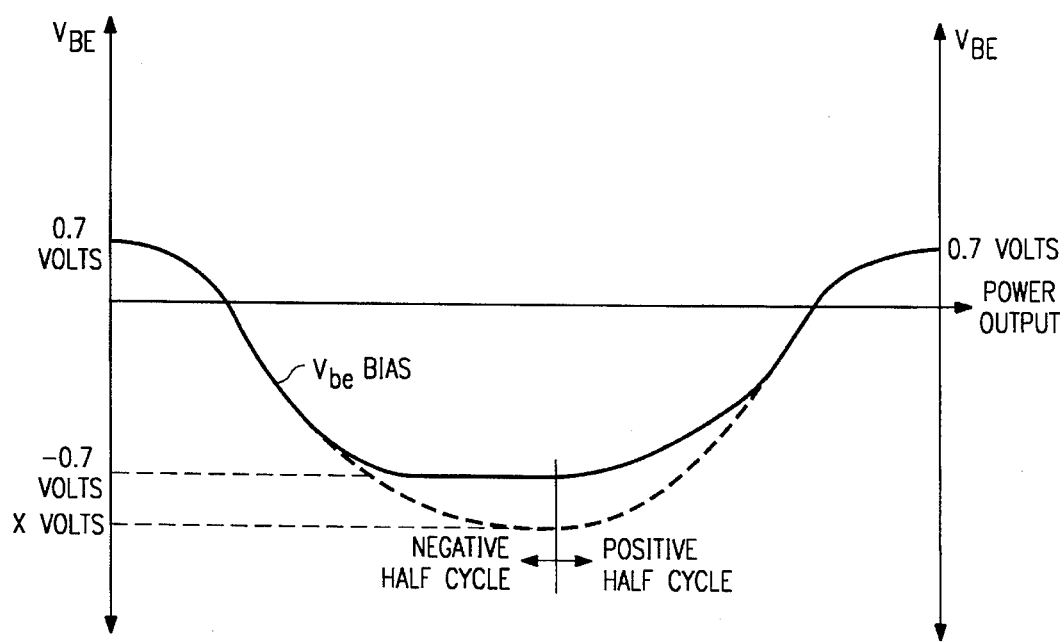
FIG. 2 is a graph showing a second Vbe bias curve for a RF transistor, according to the prior art.
Figure 3:
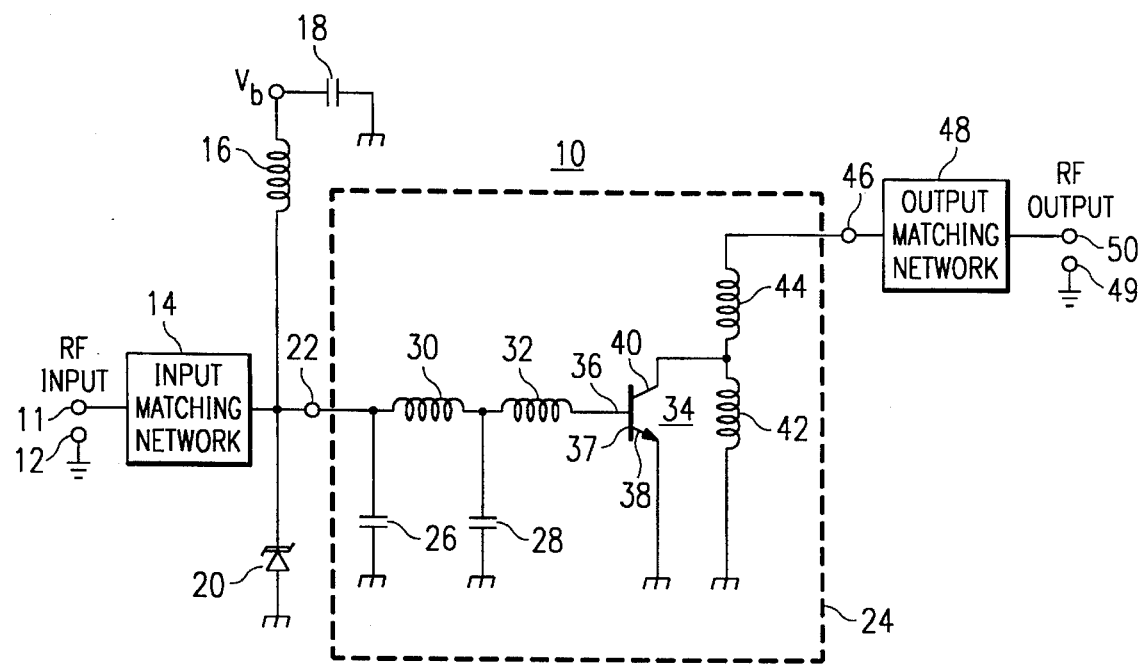
FIG. 3 is a schematic diagram of RF transistor circuitry which utilizes schottky diode technology, according to the present invention.

Referring to FIG. 3, RF transistor circuitry 10 which utilizes schottky diode technology, according to the present invention, is shown. An RF Input signal applied across terminals 11 and 12 propagates through Input Matching Network 14, base lead 22, and transistor matching circuitry 24 to the base 36 of RF transistor 34, which has a base 36, an emitter 38, and a collector 40. The output signal of RF transistor 34 passes through collector lead 46 and Output Matching Network 48 to terminals 49 and 50 of the RF Output signal.

Assuming operation in the Class AB mode of operation, RF transistor 34 has a conduction angle of 180° to 360°, which means that RF transistor 34 is on during the positive half of a RF cycle and off during the negative half of the RF cycle. As discussed in the Background of the Invention, during the negative half of the RF cycle when RF transistor 34 is off, the capacitance associated with the base-emitter junction 37 of RF transistor 34 stores charge that increases in proportion to the negative-going voltage of the negative half cycle.

To limit the amount of charge stored by the capacitance of base-emitter junction 37, the present invention utilizes low capacitance, low voltage turn-on schottky diode 20 which is 180° out of phase with RF transistor 34. Schottky diode 20 is ideal for this application because it turns on at a relatively low reverse voltage level of approximately −0.2 to −0.3 volts during the negative half of the RF cycle and thus acts as a current sink, bleeding off most of the charge stored by base-emitter junction 37 of RF transistor 34. Schottky diode 20 is balanced by inductor 16, base voltage Vb, and capacitor 18 which together act as a Vbe current source. Schottky diode 20 bleeds off stored charge such that during a subsequent positive half cycle, RF transistor 34 has to overcome substantially less stored charge than without schottky diode 20. And, of course, the less stored charge that must be overcome, the faster the switching speed of RF transistor 34. As a goal, of course, it would be desirable to make the reverse breakdown voltage (Vbr) level of schottky diode 20 as large as possible, and the forward voltage ($V_f$ or $V_{barrier}$) level as low as possible.

Figure 4:
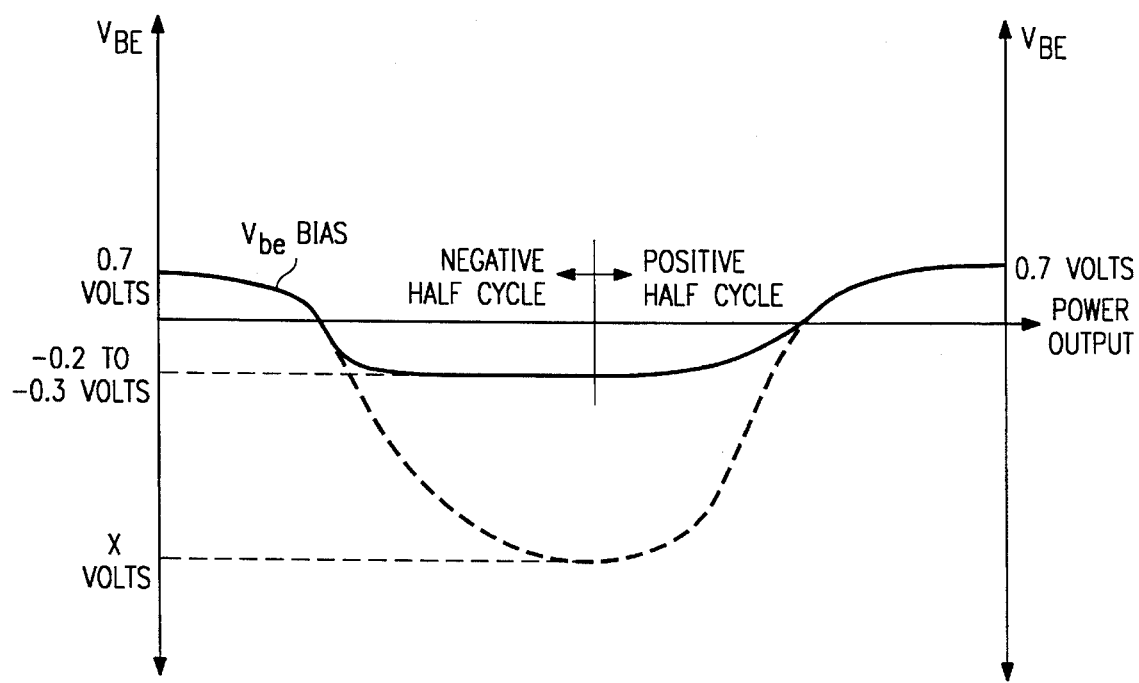
FIG. 4 is a graph showing a Vbe bias curve for RF transistor circuitry which utilizes shottky diode technology, according to the present invention.

Referring to FIG. 4, a graph showing a Vbe bias curve for RF transistor circuitry, according to the present invention is shown. The Vbe bias curve is negative-going only until −0.2 to −0.3 volts is reached, the point at which schottky diode 20 turns on and bleeds off stored charge. Placement of schottky diode 20 limits the maximum negative deviation of the input signal to −0.2 to −0.3 volts by causing schottky diode 20 to be forward biased, thereby not allowing RF transistor base-emitter junction 37 to become sufficiently reverse biased, thereby eliminating excessive reactively stored charge. −0.2 to −0.3 volts under average and AC conditions represents a significant improvement over the −0.7 volt DC level of the prior art. Thus, the present invention limits the strongly negative level of reactively stored charge in the biasing network of the RF transistor during the negative half of the RF input signal, and in so doing, minimizes adverse affects on the linearity and reliability of the RF transistor.

Related to the benefit of limiting the amount of stored charge seen by RF transistor 34 during the positive half of the RF cycle is the additional advantage that the sliding bias point problem described in the Background of the Invention is minimized. As the RF transistor moves from a reverse bias to a forward bias condition, the bias point of the RF transistor remains relatively constant on its load line, perhaps only moving slightly down the load line in the negative direction such that the class of operation of the RF transistor is minimally affected. Thus, if RF transistor 34 is in the Class AB mode of operation it is not likely to be forced into a Class B or a Class C mode of operation. Thus, non-linear distortion caused by the sliding bias point problem is minimized. Additionally, even though schottky diode 20 is a non-linear device, it does not introduce distortion to RF transistor circuitry 10, because when shottky diode 20 is on bleeding stored charge to ground, RF transistor 34 is off. Therefore, any distortion introduced by shottky diode 20 does not adversely affect RF transistor 34.

Yet another advantage related to the use of schottky diode technology in RF transistor circuitry is present in the form of increased gain, especially if transistor 34 is operating in Class AB, a mode of operation with inherently attractive gain characteristics. The increased gain using the present invention may be attributed to an apparent increase of the conduction angle of RF transistor 34, without having to increase its forward bias. Gain in the range of 0.1 dB to 1.0 dB may be realized.

Schottky diode 20 has a low capacitance associated with it that, while very small, is capable of creating an undesirable reactance that may be countered by physically placing schottky diode 20 at a low impedance point so that less loading and reactance is seen by RF transistor circuitry 10. Generally speaking, the closer schottky diode 20 is placed to RF transistor 34, the lower the impedance point. Referring again to FIG. 3, schottky diode is shown positioned relatively close to RF transistor 34 outside the RF transistor package, but is still separated from RF transistor 34 by base lead 22 and matching elements contained in transistor matching circuitry 24 inside the package of RF transistor 34. The package of RF transistor 34 is defined by base lead 22 and collector lead 46. MOSCAPs 26, 28 and shunt inductors 30, 32, 42, and 44 are matching elements contained within the package of RF transistor 34 which provide the matching necessary to connect RF transistor 34 with the outside world through base lead 22 and collector lead 46.

The reactance caused by the capacitance of schottky diode 20 may be minimized by placing schottky diode 20 even closer to RF transistor 34. For example, placing schottky diode 20 inside the package of RF transistor 34 on MOSCAP 26 or 28 would introduce schottky diode 20 into the circuit at a lower impedance point. Taking this to its logical conclusion, the lowest impedance point would be achieved by placing schottky diode 34 directly on the die of RF transistor 34. Furthermore, placement of the schottky diode 20 within the transistor matching circuitry 24 of RF transistor 34 limits the maximum negative deviation of the input signal to −0.2 to −0.3 volts. Placement of the schottky diode 20 within the RF transistor package causes schottky diode 20 to be forward biased, thereby not allowing the RF transistor's base-emitter junction 37 to be sufficiently reverse biased to store charge.

A second rationale advanced for placing schottky diode 20 close to RF transistor 4 has to do with the conduction angle of RF transistor 34. In Class AB operation, for example, RF transistor 34 and schottky diode 20 are 180° out of phase with each other and this allows schottky diode 20 to bleed the maximum amount of stored charge during the negative half of the RF cycle. As shown in FIG. 3, shottky diode 20 is separated from RF transistor 34 by the matching elements of transistor matching circuitry 24 which may introduce lead/lag phase angles that offset the out of phase angle between schottky diode 20 and RF transistor 34 so that it is less than 180°. Placing schottky diode 20 closer to RF transistor 34 or actually on the die of RF transistor 34 will contribute greatly to preserving the 180° out of phase relationship between the two.

Finally, a third rationale for placing schottky diode 20 close to RF transistor 34 is that so doing will minimize potential resonance affects. For example, the schottky diode's capacitive reactance may be removed by resonating schottky diode 20 with a series inductance. A lead length of RF transistor 34 or a wire bond to schottky diode 20 lends itself readily for this purpose, as RF transistor must be connected to the rest of circuitry 10 anyway. Care must be taken as to the frequency at which the resonance occurs, such that unwanted side affects in the pass band (i.e. group delay) are not evident.

The present invention has been described with regard to a RF common emitter transistor operating in Class AB mode. However, the present invention may be used in a variety of other modes of operation such as Class B or Class C which offer different advantages. For instance, if efficiency as well as gain and linearity are important considerations, Class C operation may be appropriate. Using the present invention, it is possible to place an RF transistor in the Class C mode of operation to affect increased efficiency while still obtaining the gain and linearity characteristics normally associated with Class AB mode of operation.

The present invention may also be used for a RF common base transistor in Class C mode of operation simply by re-orienting schottky diode 20 and placing RF transistor 20 in Class C. Because schottky diode 20 is only on during the portion of the RF cycle when RF transistor 34 is off. Thus, by re-orienting schottky diode 20, it may be on during the positive half of the RF cycle while RF transistor 34 is off. Thus, the same improvements seen in a common-emitter configuration is also achievable in a common-base configuration. In fact, there may be an enhanced improvement in the common base mode because the increased rise time may be overshadowed by the effect of the shottky diode.

While the invention has been particularly shown and described with reference to a preferred embodiment, it will be understood by those skilled in the art that various changes in form and detail may be made therein without departing from the spirit and scope of the invention.

What is claimed is:

1. RF transistor circuitry which limits the amount of stored charge which must be overcome by a RF transistor when it attempts to turn on, comprising:

a RF transistor, having a base, a collector, and an emitter, which is located on a RF transistor die contained within a RF transistor package having a plurality of matching elements connecting to the base of said RF transistor;

a schottky diode circuit connected to the base of the RF transistor and located physically close to the RF transistor;

an input matching network connected between a RF input signal and the schottky diode circuit;

an output matching network connected to an output signal of the RF transistor; and said RF input signal, representative of an RF cycle, is applied to the base of the transistor through the input matching network, wherein during a first portion of the RF cycle when the RF transistor is off, the schottky diode circuit limits the amount of charge which is stored by a base-emitter junction of the RF transistor, to a predetermined level of reactively stored charge, such that when the RF transistor attempts to turn on during a second portion of the RF cycle the RF transistor must only overcome the predetermined level of reactively stored charge.

2. The circuitry of claim 1, wherein the schottky diode circuit is contained within the RF transistor package.

3. The circuitry of claim 2, wherein the schottky diode circuit is comprised of a schottky diode, having a forward bias level, and a current source connected to each other and to the base of the RF transistor.

4. The circuitry of claim 3, wherein the schottky diode is located on the RF transistor die.

5. The circuitry of claim 3, wherein the schottky diode is connected to a matching element of the plurality of matching elements.

6. The circuitry of claim 5, wherein the matching element is a MOSCAP.

7. The circuitry of claim 3, wherein the predetermined level of reactively stored charge is a function of the forward bias level of the schottky diode.

8. The circuitry of claim 2, wherein the schottky diode circuit is comprised of a schottky diode, having a forward bias level, connected to the base of the RF transistor.

9. The circuitry of claim 8, wherein the schottky diode is located on the RF transistor die.

10. The circuitry of claim 8, wherein the schottky diode is connected to a matching element of the plurality of matching elements.

11. The circuitry of claim 10, wherein the matching element is a MOSCAP.

12. The circuitry of claim 8, wherein the predetermined level of reactively stored charge is a function of the forward bias level of the schottky diode.

13. A method for limiting the amount of stored charge which a RF transistor must overcome when the RF transistor attempts to turn on, comprising the steps of:

applying a RF input signal, representative of a RF cycle, to a base of a RF transistor of a RF transistor circuit, wherein the RF transistor circuit is comprised of the RF transistor, having the base, a collector, and an emitter, which is located on a RF transistor die contained within a RF transistor package having a plurality of matching elements connecting to said base of said RF transistor; a schottky diode circuit connected to the base of the RF transistor and located physically close between said RF input signal; an input matching network connected to the RF transistor and the schottky diode circuit; and an output matching network connected to an output signal of the RF transistor; and limiting the amount of charge, to a predetermined level of reactively stored charge, stored by a base-emitter junction of the RF transistor during a first portion of the RF cycle when the RF transistor is off, such that when the RF transistor attempts to turn on during a second portion of the RF cycle, the RF transistor must only overcome the predetermined level of reactively stored charge.

14. The method of claim 13, wherein limiting the amount of charge to a predetermined level of reactively stored charge is accomplished by the schottky diode circuit.

15. The method of claim 14, wherein the schottky diode circuit is contained within the RF transistor package.

16. The method of claim 15, wherein the schottky diode circuit is comprised of a schottky diode, having a forward bias level, and a current source connected to each other and to the base of the RF transistor.

17. The method of claim 16, wherein the schottky diode is located on the RF transistor die.

18. The method of claim 16, wherein the schottky diode is connected to a matching element of the plurality of matching elements.

19. The method of claim 18, wherein the matching element is a MOSCAP.

20. The method of claim 16, wherein the predetermined level of reactively stored charge is a function of the forward bias level of the schottky diode.

21. The method of claim 15, wherein the schottky diode circuit is comprised of a schottky diode, having a forward bias level, connected to the base of the RF transistor.

22. The method of claim 21, wherein the schottky diode is located on the RF transistor die.

23. The method of claim 21, wherein the schottky diode is connected to a matching element of the plurality of matching elements.

24. The method of claim 23, wherein the matching element is a MOSCAP.

25. The method of claim 21, wherein the predetermined level of reactively stored charge is a function of the forward bias level of the schottky diode.

* * * * *